(12) United States Patent
Li et al.

(10) Patent No.: US 11,107,755 B2
(45) Date of Patent: Aug. 31, 2021

(54) PACKAGING FOR LATERAL HIGH VOLTAGE GaN POWER DEVICES

(71) Applicants: Zhanming Li, West Vancouver (CA); Yue Fu, Coquitlam (CA); Yan-Fei Liu, Kingston (CA)

(72) Inventors: Zhanming Li, West Vancouver (CA); Yue Fu, Coquitlam (CA); Yan-Fei Liu, Kingston (CA)

( * ) Notice: Subject to any disclaimer, the term of this patent is extended or adjusted under 35 U.S.C. 154(b) by 0 days.

(21) Appl. No.: 16/871,026

(22) Filed: May 10, 2020

(65) Prior Publication Data
US 2020/0357727 A1  Nov. 12, 2020

Related U.S. Application Data

(60) Provisional application No. 62/846,667, filed on May 12, 2019.

(51) Int. Cl.
*H01L 23/495* (2006.01)
*H01L 23/00* (2006.01)

(52) U.S. Cl.
CPC .... *H01L 23/49562* (2013.01); *H01L 23/4952* (2013.01); *H01L 23/49568* (2013.01); *H01L 24/32* (2013.01); *H01L 24/48* (2013.01); *H01L 24/73* (2013.01); *H01L 24/92* (2013.01); *H01L 2224/32245* (2013.01); *H01L 2224/48245* (2013.01); *H01L 2224/73265* (2013.01); *H01L 2224/92247* (2013.01)

(58) Field of Classification Search
CPC ....... H01L 23/4952; H01L 2224/92247; H01L 2924/10253; H01L 2224/48227; H01L 2224/48247; H01L 2224/73265; H01L 2224/32245; H01L 24/32; H01L 2224/32225; H01L 2224/48245; H01L 24/48; H01L 23/49562; H01L 2924/1306; H01L 2924/1033; H01L 2924/181; H01L 2224/48091; H01L 2224/8385
See application file for complete search history.

(56) References Cited

U.S. PATENT DOCUMENTS

| | | | |
|---|---|---|---|
| 2012/0211901 A1* | 8/2012 | Shimizu | H01L 24/29 257/783 |
| 2018/0096961 A1* | 4/2018 | Hashizume | H01L 24/48 |
| 2020/0274319 A1* | 8/2020 | Alapati | H01S 5/02208 |

\* cited by examiner

*Primary Examiner* — Jasmine J Clark

(57) ABSTRACT

Packaging methods and structures for lateral high voltage gallium nitride (GaN) devices achieve electrical isolation while also maintaining thermal dissipation. The electrical isolation reduces or eliminates vertical leakage current, improving high voltage performance. The packages may use or be compatible standards such as JEDEC, which reduces packaging cost and facilitates implementation of the packaged devices in conventional circuit design approaches.

22 Claims, 4 Drawing Sheets

PACKAGING FOR LATERAL HIGH VOLTAGE GAN POWER DEVICES

RELATED APPLICATION

This application claims the benefit of the filing date of Application No. 62/846,667, filed on May 12, 2019, the contents of which are incorporated herein by reference in their entirety.

FIELD

The invention relates to packaging of lateral power electronic devices. More specifically, the invention relates to packaging of lateral power electronic devices that reduces or eliminates vertical leakage current.

BACKGROUND

Gallium nitride (GaN) power electronic devices feature favourable performance characteristics such as high efficiency and high power density, and are expected to replace silicon (Si) and silicon carbide (SiC) as the dominant power devices. One particular technology of great promise is GaN grown on a silicon substrate (GaN/Si), which offers superior performance with low cost.

However, power device implementations using GaN/Si face a number of limitations. One is that the silicon substrate is of p-minus doping and cannot sustain high voltage, particularly in the vertical direction (i.e., perpendicular to the plane of the device die). This is evident as substrate leakage when the voltage is high (e.g., greater than 1,000 V).

Another limitation is that GaN/Si power devices are lateral devices in which electrodes (e.g., gate, drain, source of a field-effect transistor (FET)) are arranged on the same side (e.g., the top) of the device, and current flows laterally across the device between electrodes. As such, conventional packaging formats that are typically intended for use with vertical devices in which electrodes are arranged on opposite sides (e.g., the top and bottom) of the device, and current flows vertically through the device, cannot be used.

SUMMARY

According to one aspect of the invention there is provided a packaged semiconductor device, comprising: a lateral semiconductor power device chip comprising an upper surface having at least two electrodes disposed thereon, and a lower surface, wherein the upper and lower surfaces are coplanar; at least one metal lead electrically connected to a first electrode of the at least two electrodes; a back-plate; and an electrically insulating and thermally conducting adhesive disposed between the lower surface of the lateral semiconductor power device chip and the back-plate; wherein the back-plate comprises at least a metal portion that is electrically connected to a second electrode of the at least two electrodes.

Another aspect of the invention relates to method for packaging a lateral semiconductor power device chip comprising an upper surface having at least two electrodes disposed thereon, and a lower surface, wherein the upper and lower surfaces are coplanar, the method comprising: electrically connecting a first electrode of the at least two electrodes to a first metal lead of a device package; disposing an electrically insulating and thermally conducting adhesive between the lower surface of the lateral semiconductor power device chip and a back-plate of the device package; wherein the back-plate comprises at least a metal portion that is electrically connected to a second electrode of the at least two electrodes.

In accordance with the above aspects, in one embodiment the back-plate comprises only the metal portion and underlies the lateral semiconductor power device chip; and the electrically insulating and thermally conducting adhesive is disposed between the lateral semiconductor power device chip and the back-plate.

In accordance with the above aspects, in one embodiment the back-plate comprises the metal portion and an electrically insulating and thermally conducting portion disposed on the metal portion; wherein the lateral semiconductor power device chip is disposed over the electrically insulating and thermally conducting portion of the back-plate; wherein the electrically insulating and thermally conducting adhesive is disposed between the lateral semiconductor power device chip and the electrically insulating and thermally conducting portion of the back-plate.

In accordance with the above aspects, in one embodiment the electrically insulating and thermally conducting portion of the back-plate has an area larger than or equal to an area of the lateral semiconductor power device chip.

In accordance with the above aspects, in one embodiment the back-plate comprises the metal portion and an electrically insulating and thermally conducting portion disposed adjacent the metal portion; wherein the lateral semiconductor power device chip is disposed over the electrically insulating and thermally conducting portion of the back-plate; wherein the electrically insulating and thermally conducting adhesive is disposed between the lateral semiconductor power device chip and the electrically insulating and thermally conducting portion of the back-plate.

In accordance with the above aspects, in one embodiment the electrically insulating and thermally conducting portion of the back-plate has an area larger than or equal to an area of the lateral semiconductor power device chip, and has a thickness that extends to a bottom of the packaged semiconductor device.

In accordance with the above aspects, in one embodiment the respective electrical connections between the at least first and second electrodes and at least one metal lead and the metal portion of the back-plate are established by bond wires.

In accordance with the above aspects, in one embodiment the lateral semiconductor power device chip is a field-effect transistor (FET); wherein the first electrode is a gate electrode and is electrically connected to a first metal lead; wherein the second electrode is a source electrode and is electrically connected to the metal portion of the back-plate; wherein a third electrode is a drain electrode and is electrically connected to a second metal lead.

In accordance with the above aspects, in one embodiment the lateral semiconductor power device chip is a FET; wherein the first electrode is a gate electrode and is electrically connected to a first metal lead; wherein the second electrode is a drain electrode and is electrically connected to the metal portion of the back-plate; wherein a third electrode is a source electrode and is electrically connected to a second metal lead.

In accordance with the above aspects, in various embodiments the lateral semiconductor power device chip comprises a GaN, GaN/GaN, GaN/Si, or GaN/ceramic technology.

In accordance with the above aspects, the package may conform with a JEDEC standard format.

Another aspect of the invention relates to a packaged semiconductor power device comprising a semiconductor chip of lateral conduction type GaN grown on silicon; an electrically insulating and thermally conducting adhesive that adheres the semiconductor chip to a back-plate; wherein the back-plate is metal; wherein a source electrode of the semiconductor chip is wire-bond connected to the metal back-plate and gate and drain electrodes of the semiconductor chip are wire-bond connected to respective metal leads. In one embodiment, a drain electrode is wire-bond connected to the metal back-plate and gate and source electrodes are wire-bond connected to respective metal leads.

Another aspect of the invention relates to a packaged semiconductor power device comprising a semiconductor chip of lateral conduction type GaN grown on silicon; an electrically insulating and thermally conducting adhesive that adheres the semiconductor chip to a back-plate of the packaged semiconductor device; wherein a top portion of the back-plate that is beneath the semiconductor chip comprises an electrically insulating and thermally conducting material having an area larger than or equal to an area occupied by the semiconductor chip; wherein a bottom portion of the back-plate comprises metal; wherein a source electrode of the semiconductor chip is wire-bond connected to the metal back-plate and gate and drain electrodes of the semiconductor chip are wire-bond connected to respective metal leads. In one embodiment, a drain electrode is wire-bond connected to the metal back-plate and gate and source electrodes are wire-bond connected to respective metal leads.

Another aspect of the invention relates to a packaged semiconductor power device comprising a semiconductor chip of lateral conduction type GaN grown on silicon; an electrically insulating and thermally conducting adhesive that adheres the semiconductor chip to a back-plate of the packaged semiconductor device; wherein a portion of the back-plate that is beneath the semiconductor chip comprises an electrically insulating and thermally conducting material having an area larger than or equal to an area occupied by the semiconductor chip and a thickness that extends to the bottom of the device package; wherein a side portion of the back-plate comprises metal; wherein a source electrode of the semiconductor chip is wire-bond connected to the metal back-plate and gate and drain electrodes of the semiconductor chip are wire-bond connected to respective metal leads. In one embodiment, a drain electrode is wire-bond connected to the metal back-plate and gate and source electrodes are wire-bond connected to respective metal leads.

BRIEF DESCRIPTION OF THE DRAWINGS

For a better understanding of the invention, and to show more clearly how it may be carried into effect, embodiments will be described, by way of example, with reference to the accompanying drawings, wherein.

DETAILED DESCRIPTION OF EMBODIMENTS

Described herein are packaging structures and related methods for lateral power electronic devices based on, but not limited to, GaN, GaN/GaN, GaN/Si, and GaN/ceramic technologies. Examples of power devices include, but are not limited to, transistors (e.g., field-effect transistors (FETs)) and diodes. Embodiments overcome limitations of prior approaches to packaging such devices.

Figure 1A:
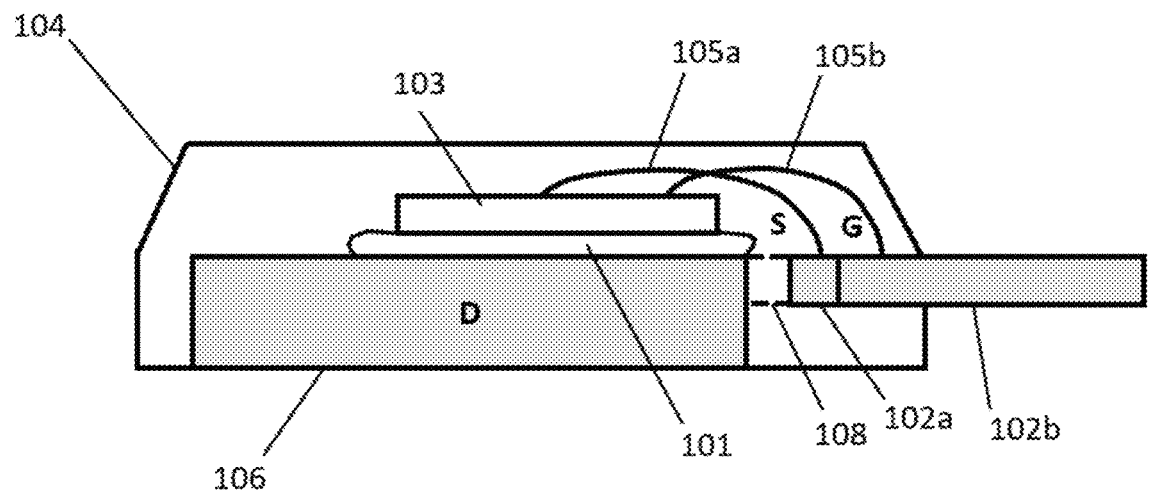
FIGS. 1A and 1B are diagrams showing side and top views, respectively, of a discrete silicon or silicon-carbide power FET package, according to the prior art.
Figure 1B:
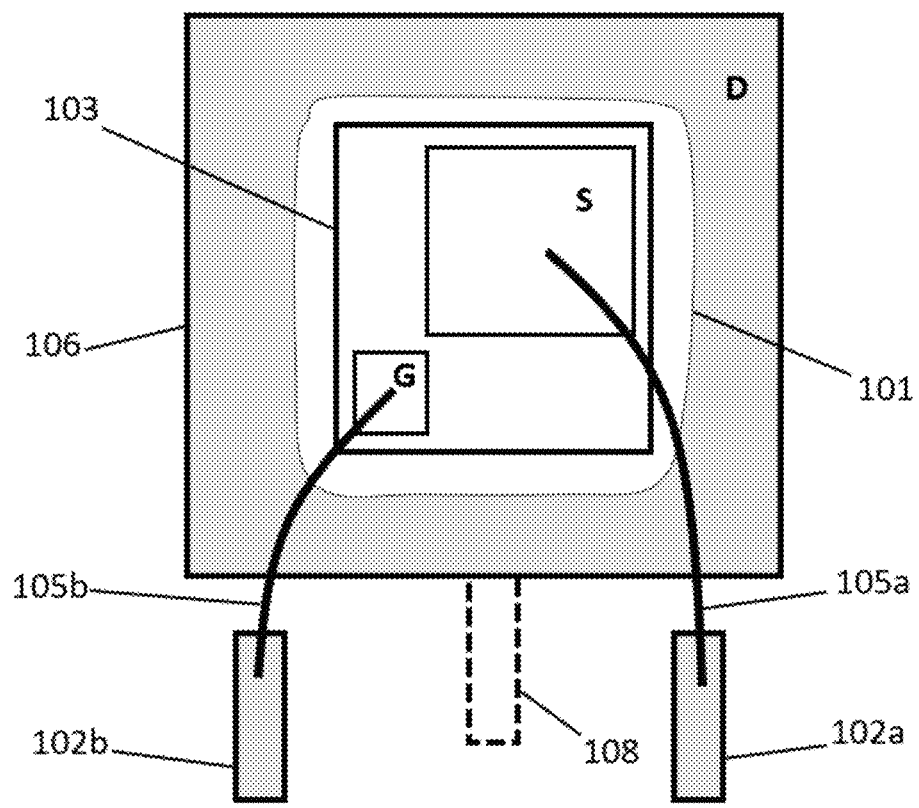

FIGS. 1A and 1B show side and top views, respectively, of a prior packaging structure typically used for discreet silicon and silicon carbide power devices. The semiconductor chip is a vertical device, that is, electrodes are disposed on opposed planar surfaces (i.e., the gate G and source S electrodes are disposed on the top surface and the drain electrode is disposed on the bottom surface, based on the orientation shown in FIG. 1A) and current flows vertically with respect to the plane of the chip. Many device package formats (e.g., JEDEC standards such as TO220, TO252, TO263) are based on such an arrangement. As shown in FIGS. 1A and 1B, the semiconductor chip 103 is adhered to a metal back-plate 106 of the package with an electrically conductive adhesive 101. Thus, when the chip is adhered to the back-plate 106, the back-plate becomes the drain electrode. The source and gate electrodes are wire-bonded 105a, 105b, respectively, to metal leads 102a and 102b (shown offset in FIG. 1A for clarity). Some package formats may provide a metal lead 108 connected to the metal back-plate 106. When used in an external circuit, the package may be soldered to a circuit board via the metal back-plate 106 and metal leads 102a, 102b. The metal lead 108, if included, may also be attached to the circuit board, and optionally it may be wire-bonded to one of the device electrodes, depending on the circuit design, or it may be removed. The packaged device is covered with a molded polymer encapsulant 104 that provides access to the metal contacts.

Figure 2:
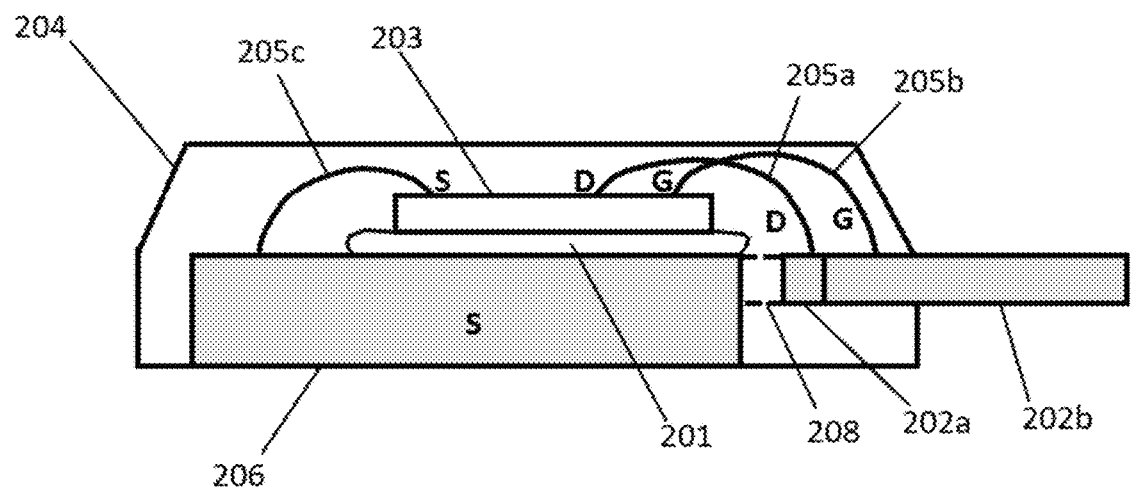
FIG. 2 is a diagram showing a side view of a discrete GaN power FET package, according to the prior art.

FIG. 2 shows a prior packaging structure for a GaN/Si chip 203. In this approach an electrically conductive adhesive 201 as in the prior approach of FIGS. 1A and 1B is used to attach the GaN/Si chip 203 on a package metal frame such as that commonly available in JEDEC standards. However, since the GaN/Si chip is a lateral device, the source S electrode is on the top surface of the device 203 and is wire-bonded 205c to the back-plate 206. The drain D and gate G electrodes are also on the top surface of the device and are wire-bonded 205a, 205b, respectively, to metal leads with 202a and 202b (shown offset in FIG. 2 for clarity). Some package formats may provide a metal lead 208 connected to the metal back-plate 206. The packaged device is covered with a molded polymer encapsulant 204 that provides access to the metal contacts.

There are at least two limitations to the approach of FIG. 2. The first is that this approach enables vertical current flow through the device (i.e., current flow perpendicular to the plane of the device die), which is undesirable for lateral devices, and the problem is exacerbated under high power, high voltage (e.g., 1,000 V and greater) where the vertical current is evident as substrate leakage. Another limitation is that designating the back-plate 206 as the source electrode renders many of the JEDEC standard packaging frames, such as TO263-7, incompatible, since these JEDEC standard frames are designed with the drain connected to the back-plate.

Figure 3:
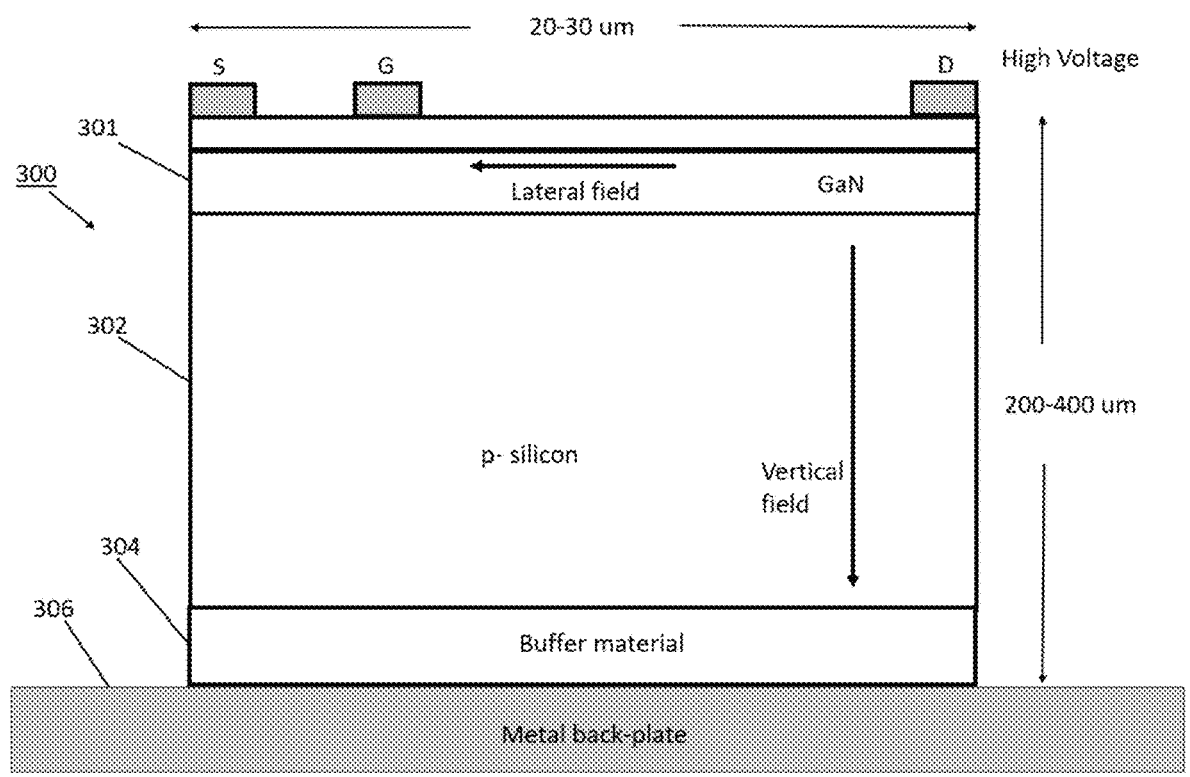
FIG. 3 is a diagram showing a side view of a structure of a GaN/Si device having a top layer of GaN grown on a silicon substrate, according to the prior art.

The vertical leakage current can be explained by considering the structure of a GaN/Si semiconductor device. An example is shown in the diagram of FIG. 3. The device 300, which may be of the range of 200-400 μm thick, includes a two-dimensional electron gas (2DEG) structure 301 based on GaN/AlGaN layers disposed on a silicon substrate 302. A buffer material 304 is inserted between the silicon substrate 302 and a metal back-plate 306. Source S, gate G, and drain D electrodes are disposed on the top surface of the chip. Due to the large difference between lateral electrode spacing and substrate thickness, the electric field within the silicon substrate 302 is mostly a vertical field. Such vertical field promotes the undesirable vertical substrate leakage. Since the prior approach, shown in FIG. 2, of using conductive adhesive 201 does not prevent the vertical leakage current, and may facilitate the vertical leakage current, the breakdown voltage of the device structure is significantly limited and such an approach is unsuitable for high power lateral devices.

In the below descriptions of embodiments a FET is used as an example of a lateral GaN power device, wherein the electrodes (gate, drain, and source) are disposed on the top surface of the device. It will be understood that other lateral GaN power devices may be used, such as diodes, wherein the electrodes (anode and cathode) are disposed on the top surface of the device.

Figure 4:
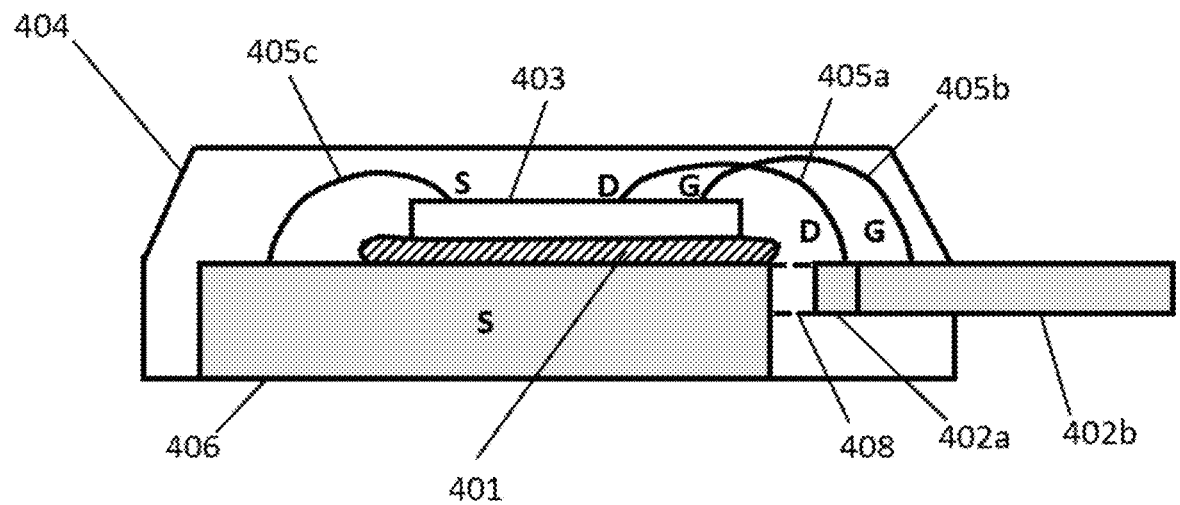
FIG. 4 is a diagram showing a side view of a GaN chip package according to one embodiment.

A device packaging structure according to one embodiment of the invention shown in FIG. 4. Referring to FIG. 4, a GaN device chip 403, comprising, e.g., a GaN grown on silicon substrate (i.e., GaN/Si), is adhered to a back-plate 406 using an electrically insulating and thermally conducting adhesive 401, such as, for example, Loctite® Ablestik™ 84-3J (Henkel Canada Corporation, Mississauga, ON) or SUMIRESIN EXCEL® CRM-1100 series (Sumitomo Bakelite Co., Ltd.). In this embodiment the back-plate is made entirely of metal. The source S electrode of the device 403 is wire-bonded 405c to the metal back-plate 406. The drain D and gate G electrodes of the device are wire-bonded 405a, 405b, respectively, to metal leads 402a and 402b of the package (shown offset in FIG. 4 for clarity). Some embodiments may include a package format with a metal lead 408 connected to the metal back-plate 406. When used in an external circuit, the package may be soldered to a circuit board via the metal back-plate 406 and metal leads 402a, 402b. The metal lead 408, if included, may also be attached to the circuit board, and optionally it may be wire-bonded to one of the device electrodes, depending on the circuit design, or it may be removed. The packaged device is covered with a molded polymer encapsulant 404 that provides access to the metal contacts. The electrically insulating and thermally conducting adhesive 401 absorbs at least some of the voltage drop from the power device substrate, and thus prevents, limits, or substantially reduces substrate vertical leakage current.

Figure 5:
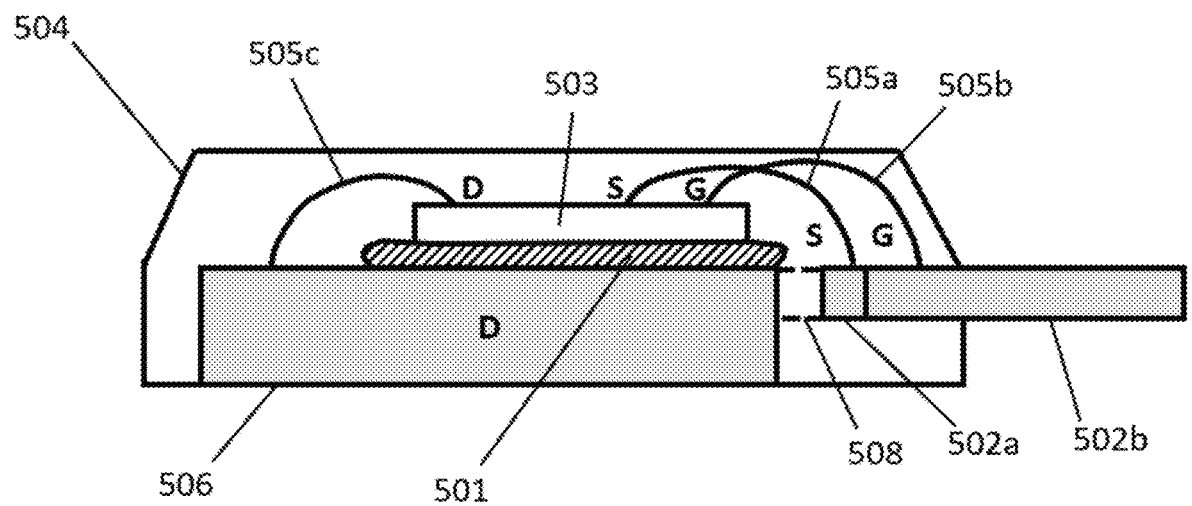
FIG. 5 is a diagram showing a side view of a GaN chip package according to another embodiment

In another embodiment, shown in FIG. 5, the packaging structure is substantially the same as that shown in the embodiment of FIG. 4, wherein a GaN device chip 503, comprising, e.g., a GaN grown on silicon substrate (i.e., GaN/Si), is adhered to a metal back-plate 506 using an electrically insulating and thermally conducting adhesive 501, such as, for example, Ablestik™ 84-3J or SUMIRESIN EXCEL® CRM-1100 series. However, in this embodiment the drain D electrode of the device 503 is wire-bonded 505c to the back-plate 506. The source S and gate G electrodes of the device are wire-bonded 505a, 505b, respectively, to metal leads 502a and 502b. Some embodiments may include a package format with a metal lead 508 connected to the metal back-plate 506. In various embodiments, the gate metal lead 502b may optionally be electrically connected to the drain metal lead 502a or to the back-plate 506, or to the metal lead 508, if provided, depending on the specific device configuration. The packaged device is covered with a molded polymer encapsulant 504 that provides access to the metal contacts. According to this embodiment, in addition to preventing, limiting, or substantially reducing substrate vertical leakage current, another benefit is that the configuration of the drain located at the bottom of the structure allows use of a standard JEDEC frame, such as TO263-7, which reduces packaging cost and makes the structure more user-friendly since it facilitates implementation in conventional circuit design approaches.

Figure 6:
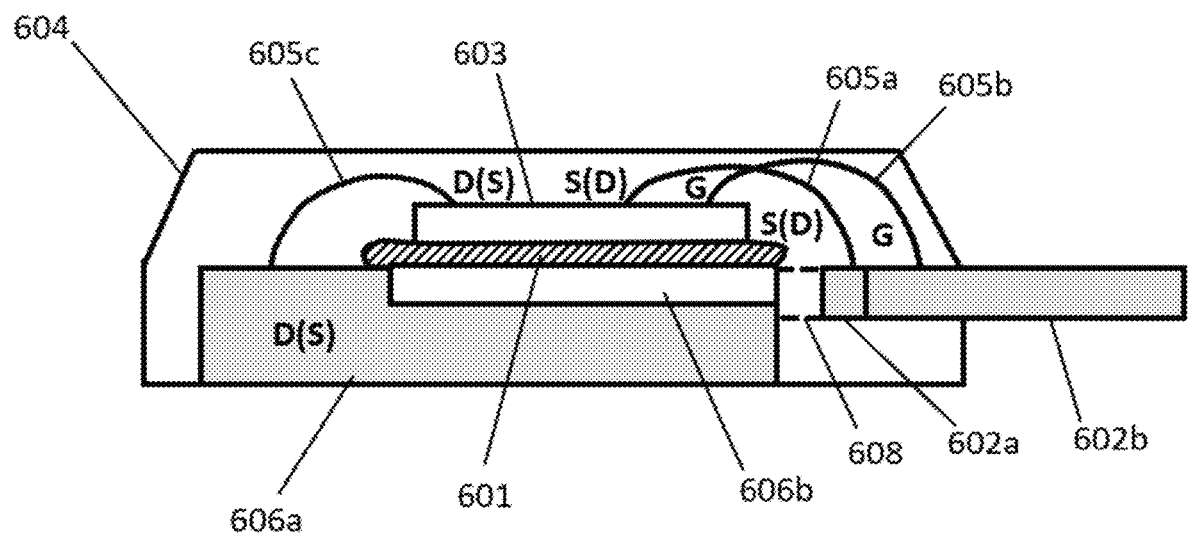
FIG. 6 is a diagram showing a side view of a GaN chip package according to another embodiment

Another embodiment is shown in FIG. 6. In this embodiment, the back-plate comprises a metal portion 606a and an electrically insulating and thermally conducting material 606b. According to this embodiment, a GaN device chip 603, comprising, e.g., a GaN/Si, is adhered to the electrically insulating and thermally conducting material 606b using an electrically insulating and thermally conducting adhesive 601, such as, for example, Ablestik™ 84-3J or SUMIRESIN EXCEL® CRM-1100 series. The material 606b may be a ceramic material such as, for example, aluminum nitride (AlN), which has a high thermal conductivity and is an electrical insulator. The material 606b may have a thickness that is similar to or less than the thickness of the chip 603, such as, for example, at least 100 μm thick. The ceramic material 606b is disposed on the metal portion 606a of the back-plate, and may be secured using an electrically insulating and thermally conducting adhesive such as that mentioned above. In this embodiment, the drain D or source S electrode of the device 603 is wire-bonded 605c to the metal back-plate 606a. The other of the source S or drain D electrode, and the gate G electrode of the device are wire-bonded 605a, 605b, respectively, to metal leads 602a and 602b. Some embodiments may include a package format with a metal lead 608 connected to the metal portion 606a of the back-plate. In various embodiments, the gate metal lead 602b may optionally be electrically connected to the metal back-plate 606a or the metal lead 602a, or the metal lead 608, if provided, depending on the specific device configuration. As shown in FIG. 6, the material 606b is beneath the semiconductor chip and has an area larger than or equal to an area occupied by the semiconductor chip. The lower portion of the back-plate 606a is metal so that maximum electrical and thermal conduction can be achieved through the back-plate to a circuit board (e.g., a printed circuit board (PCB)) on which it may be mounted. The packaged device is covered with a molded polymer encapsulant 604 that provides access to the metal contacts. The partial ceramic structure of this embodiment is suitable for large packaging formats, such as, for example, JEDEC TO263-7. An advantage of this structure is that the insulating material 606b provides additional blocking of high voltage and further reduction or elimination of substrate vertical leakage current.

Figure 7:
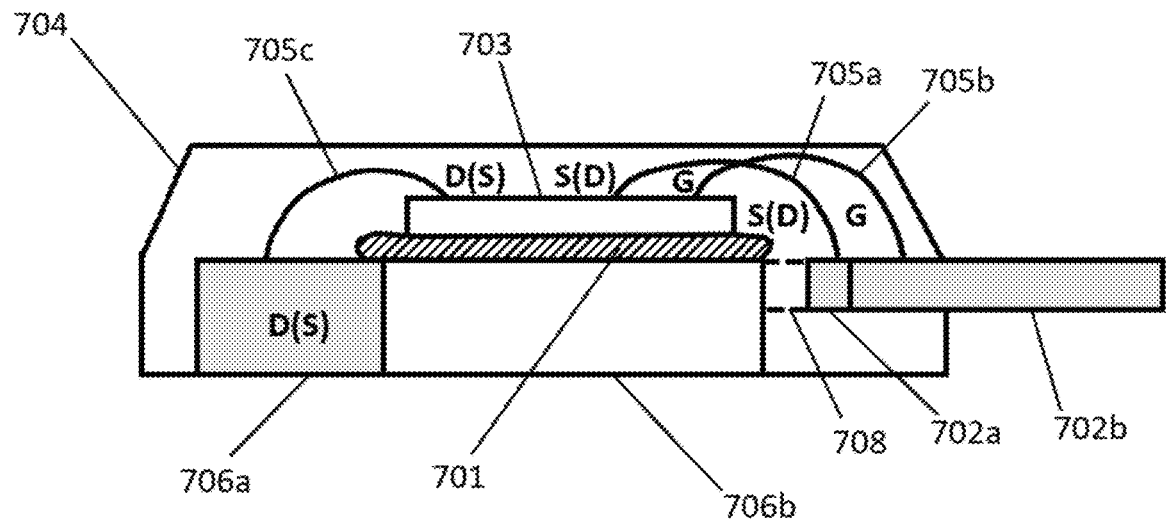
FIG. 7 is a diagram showing a side view of a GaN chip package according to another embodiment.

Another embodiment is shown in FIG. 7. In this embodiment, the back-plate comprises a metal portion 706a and an electrically insulating and thermally conducting material 706b. According to this embodiment, a GaN device chip 703, comprising, e.g., GaN/Si, is adhered to the electrically insulating and thermally conducting material 706b using an electrically insulating and thermally conducting adhesive 701, such as, for example, Ablestik™ 84-3J or SUMIRESIN EXCEL® CRM-1100 series. The material 706b may be a ceramic material such as AlN. Unlike the embodiment of FIG. 6, in this embodiment the material 706b has a thickness that extends all the way to the bottom of the package, so that it is in contact with a circuit board (e.g., a PCB) on which the package may be mounted. The material 706b is beneath the semiconductor chip and may have an area larger than or equal to an area occupied by the semiconductor chip 703. The embodiment includes a metal portion of the back-plate 706a that is disposed adjacent the material 706b, and may be adhered to the material 706b using an electrically insulating and thermally conducting adhesive such as that mentioned above. The metal back-plate 706a provides an electrical connection to the PCB on which the package is mounted from the device drain D or source S. The drain or source electrode of the device 703 is wire-bonded 705c to the metal portion of the back-plate 706a. The other of the source or drain electrode and the gate G electrode of the device are wire-bonded 705a, 705b, respectively, to metal leads 702a and 702b. Some embodiments may include a package format with a metal lead 708, which may be connected to the metal portion 606a of the back-plate, or may be floating. In the latter case, the metal lead 708 may be connected to a selected one of the electrodes using wire bonding, depending on the specific device configuration. In various embodiments, the gate metal lead 702b may optionally be electrically connected to the metal lead 702a or the back-plate 706a, depending on the specific device configuration. The packaged device is covered with a molded polymer encapsulant 704 that provides access to the metal contacts. This embodiment is suitable for smaller package formats such as a lead frame-based package (e.g., quad flat no-leads (QFN), chip scale package (CSP)) where the insulating material 708 can serve as creepage distance spacing. Advantageously, the insulating material 706b provides additional blocking of high voltage and further reduction or elimination of substrate vertical leakage current.

EQUIVALENTS

While the invention has been described with respect to illustrative embodiments thereof, it will be understood that various changes may be made to the embodiments without departing from the scope of the invention. Accordingly, the described embodiments are to be considered merely exemplary and the invention is not to be limited thereby.

The invention claimed is:

1. A packaged semiconductor device, comprising:
a lateral semiconductor power device chip comprising an upper surface having at least two electrodes disposed thereon, and a lower surface, wherein the upper and lower surfaces are coplanar;
at least one metal lead electrically connected to a first electrode of the at least two electrodes;
a back-plate;
an electrically insulating and thermally conducting adhesive disposed between the lower surface of the lateral semiconductor power device chip and the back-plate;
wherein the back-plate comprises at least a metal portion that is electrically connected to a second electrode of the at least two electrodes.

2. The packaged semiconductor device of claim 1, wherein:
the back-plate comprises only the metal portion and underlies the lateral semiconductor power device chip; and the electrically insulating and thermally conducting adhesive is disposed between the lateral semiconductor power device chip and the back-plate.

3. The packaged semiconductor device of claim 2, wherein:
the back-plate comprises the metal portion and an electrically insulating and thermally conducting portion disposed on the metal portion;
wherein the lateral semiconductor power device chip is disposed over the electrically insulating and thermally conducting portion of the back-plate;
wherein the electrically insulating and thermally conducting adhesive is disposed between the lateral semiconductor power device chip and the electrically insulating and thermally conducting portion of the back-plate.

4. The packaged semiconductor device of claim 3, wherein:
the electrically insulating and thermally conducting portion of the back-plate has an area larger than or equal to an area of the lateral semiconductor power device chip.

5. The packaged semiconductor device of claim 1, wherein:
the back-plate comprises the metal portion and an electrically insulating and thermally conducting portion disposed adjacent the metal portion;
wherein the lateral semiconductor power device chip is disposed over the electrically insulating and thermally conducting portion of the back-plate;
wherein the electrically insulating and thermally conducting adhesive is disposed between the lateral semiconductor power device chip and the electrically insulating and thermally conducting portion of the back-plate.

6. The packaged semiconductor device of claim 5, wherein:
the electrically insulating and thermally conducting portion of the back-plate has an area larger than or equal to an area of the lateral semiconductor power device chip, and has a thickness that extends to a bottom of the packaged semiconductor device.

7. The packaged semiconductor device of claim 1, wherein:
respective electrical connections between the at least first and second electrodes and at least one metal lead and the metal portion of the back-plate are established by bond wires.

8. The packaged semiconductor device of claim 1, wherein:
the lateral semiconductor power device chip is a field-effect transistor (FET);
wherein the first electrode is a gate electrode and is electrically connected to a first metal lead;
wherein the second electrode is a source electrode and is electrically connected to the metal portion of the back-plate;
wherein a third electrode is a drain electrode and is electrically connected to a second metal lead.

9. The packaged semiconductor device of claim 1, wherein:
the lateral semiconductor power device chip is a FET;
wherein the first electrode is a gate electrode and is electrically connected to a first metal lead;
wherein the second electrode is a drain electrode and is electrically connected to the metal portion of the back-plate;
wherein a third electrode is a source electrode and is electrically connected to a second metal lead.

10. The packaged semiconductor device of claim 1, wherein:
the lateral semiconductor power device chip comprises a GaN, GaN/GaN, GaN/Si, or GaN/ceramic technology.

11. The packaged semiconductor device of claim 1, wherein:
the package conforms with a JEDEC standard format.

12. A method for packaging a lateral semiconductor power device chip comprising an upper surface having at least two electrodes disposed thereon, and a lower surface, wherein the upper and lower surfaces are coplanar, the method comprising:
electrically connecting a first electrode of the at least two electrodes to a first metal lead of a device package;
disposing an electrically insulating and thermally conducting adhesive between the lower surface of the lateral semiconductor power device chip and a back-plate of the device package;
wherein the back-plate comprises at least a metal portion that is electrically connected to a second electrode of the at least two electrodes.

13. The method of claim 12, wherein:
the back-plate comprises only the metal portion and underlies the lateral semiconductor power device chip; and
the electrically insulating and thermally conducting adhesive is disposed between the lateral semiconductor power device chip and the back-plate.

14. The method of claim 12, wherein:
the back-plate comprises the metal portion and an electrically insulating and thermally conducting portion disposed on the metal portion;
wherein the lateral semiconductor power device chip is disposed over the electrically insulating and thermally conducting portion of the back-plate;
wherein the electrically insulating and thermally conducting adhesive is disposed between the lateral semiconductor power device chip and the electrically insulating and thermally conducting portion of the back-plate.

15. The method of claim 14, wherein:
the electrically insulating and thermally conducting portion of the back-plate has an area larger than or equal to an area of the lateral semiconductor power device chip.

16. The method of claim 12, wherein:
the back-plate comprises the metal portion and an electrically insulating and thermally conducting portion disposed adjacent the metal portion;
wherein the lateral semiconductor power device chip is disposed over the electrically insulating and thermally conducting portion of the back-plate;
wherein the electrically insulating and thermally conducting adhesive is disposed between the lateral semiconductor power device chip and the electrically insulating and thermally conducting portion of the back-plate.

17. The packaged semiconductor device of claim 16, wherein:
the electrically insulating and thermally conducting portion of the back-plate has an area larger than or equal to an area of the lateral semiconductor power device chip, and has a thickness that extends to a bottom of the packaged semiconductor device.

18. The method of claim 12, wherein:
respective electrical connections between the at least first and second electrodes and at least one metal lead and the metal portion of the back-plate are established by bond wires.

19. The method of claim 12, wherein:
the lateral semiconductor power device chip is a field-effect transistor (FET);
wherein the first electrode is a gate electrode and is electrically connected to the first metal lead;
wherein the second electrode is a source electrode and is electrically connected to the metal portion of the back-plate;
wherein a third electrode is a drain electrode and is electrically connected to a second metal lead of the package.

20. The method of claim 12, wherein:
the lateral semiconductor power device chip is a FET;
wherein the first electrode is a gate electrode and is electrically connected to the first metal lead;
wherein the second electrode is a drain electrode and is electrically connected to the metal portion of the back-plate;
wherein a third electrode is a source electrode and is electrically connected to a second metal lead of the package.

21. The method of claim 12, wherein:
the lateral semiconductor power device chip comprises a GaN, GaN/GaN, GaN/Si, or GaN/ceramic technology.

22. The method of claim 12, wherein:
the package conforms with a JEDEC standard format.

* * * * *